(12) United States Patent
Lukanc et al.

(10) Patent No.: US 6,211,071 B1
(45) Date of Patent: Apr. 3, 2001

(54) OPTIMIZED TRENCH/VIA PROFILE FOR DAMASCENE FILLING

(75) Inventors: Todd P. Lukanc; Fei Wang, both of San Jose; Steven C. Avanzino, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/296,552

(22) Filed: Apr. 22, 1999

(51) Int. Cl.$^7$ ................................................. H01L 21/4763
(52) U.S. Cl. ......................... 438/640; 438/624; 438/666; 438/672; 438/678; 438/687
(58) Field of Search ..................... 438/640, 687, 438/624, 666, 672, 678

(56) References Cited

U.S. PATENT DOCUMENTS

| | | | |
|---|---|---|---|
| 5,730,835 | * 3/1998 | Roberts et al. | 156/656.1 |
| 5,801,094 | * 9/1998 | Yew et al. | 438/624 |
| 5,874,201 | * 2/1999 | Licata et al. | 430/314 |
| 5,888,902 | * 3/1999 | Jun | 438/637 |
| 5,933,756 | * 8/1999 | Fuse | 438/640 |
| 5,972,789 | * 10/1999 | Jeng et al. | 438/637 |
| 6,028,001 | * 2/2000 | Shin | 438/640 |
| 6,060,385 | * 5/2000 | Givens | 438/640 |
| 6,074,942 | * 6/2000 | Lou | 438/637 |
| 6,080,663 | * 6/2000 | Chen et al. | 438/637 |
| 6,117,785 | * 9/2000 | Lee et al. | 438/640 |

* cited by examiner

Primary Examiner—John F. Niebling
Assistant Examiner—Lynne A. Gurley

(57) ABSTRACT

In-laid metallization patterns, e.g., of copper or copper alloy, are formed in the surface of a dielectric layer with significantly improve reliability by voidlessly filling recesses formed in the dielectric layer surface by electroplating. Embodiments include preventing "pinching-off" of the recess opening due to overhanging nucleation/seed layer deposits at the corners of the opening as a result of localized increased rates of deposition. Further embodiments include providing a dual-layered dielectric layer comprising different dielectric materials and performing a first, isotropic etching process of the upper lamina of the dielectric layer for selectively tapering the width of the recess mouth opening to provide a wider opening at the substrate surface, followed by a second, anisotropic etching process for extending the recess at a substantially constant width for a predetermined depth into the lower lamina of the dielectric layer. The tapered width profile of the recess effectively prevents formation of overhanging deposits thereat which can result in occlusion and void formation during electroplating for filling the recesses.

18 Claims, 4 Drawing Sheets

↓ ELECTROPLATE Cu

↓ CMP Cu

OPTIMIZED TRENCH/VIA PROFILE FOR DAMASCENE FILLING

CROSS-REFERENCE TO RELATED APPLICATIONS

This application contains subject matter similar to subject matter disclosed in U.S. patent applications Ser. No. 09/296,556, filed Apr. 22, 1999, now U.S. Pat. No. 6,117,782; Ser. No. 09/296,553, filed Apr. 22, 1999, now U.S. Pat. No. 6,117,781; and Ser. No. 09/296,554, filed Apr. 22, 1999, now U.S. Pat. No. 6,121,149.

FIELD OF THE INVENTION

The present invention relates to a method for forming a layer of an electrically conductive material filling a plurality of spaced apart recesses formed in the surface of a substrate, wherein the exposed upper surface of the layer is substantially coplanar with non-recessed areas of the substrate surface. More particularly, the invention relates to a "back-end" metallization method of manufacturing high-speed integrated circuit semiconductor devices having sub-micron dimensioned design features and high conductivity interconnect features, which method enables complete filling of the recesses, facilitates subsequent planarization of the metallized surface by chemical-mechanical polishing (CMP), increases manufacturing throughput, and improves product quality.

BACKGROUND OF THE INVENTION

The present invention relates to a method for forming metal films as part of metallization processing of particular utility in integrated circuit semiconductor device and circuit board manufacture, and is especially adapted for use in processing employing "damascene" (or "in-laid") technology.

The escalating requirements for high density and performance associated with ultra large scale integration (ULSI) semiconductor device wiring are difficult to satisfy in terms of providing submicron-sized (e.g., 0.18 µm and below), low resistance-capacitance (RC) time constant metallization patterns, particularly wherein the submicron-sized metallization features such as vias, contact areas, grooves, trenches, etc., have high aspect (i.e., depth-to-width) ratios due to microminiaturization.

Semiconductor devices of the type contemplated herein typically comprise a semiconductor wafer substrate, usually of doped monocrystalline silicon, and a plurality of sequentially formed interlayer dielectrics and conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced apart metallization layers are electrically connected by a vertically oriented conductive plug filling a via hole formed in the interlayer dielectric separating the layers, while another conductive plug filling a contact area hole establishes electrical contact with an active region, such as a source/drain region, formed in or on the semiconductor substrate. Conductive lines formed in groove or trench-like openings in overlying dielectric layers extend substantially parallel to the semiconductor substrate. Semiconductor devices of such type fabricated according to current technology may comprise five or more layers of such metallization in order to satisfy device geometry and miniaturization requirements.

Electrically conductive films or layers of the type contemplated herein for use in e.g., "back-end" semiconductor manufacturing technology as required for fabrication of devices as above described typically comprise a metal such as titanium, tantalum, tungsten, aluminum, chromium, nickel, cobalt, silver, gold, copper, and their alloys. In use, each of the recited metals presents advantages as well as drawbacks. For example, aluminum (Al) is relatively inexpensive, exhibits low resistivity, and is relatively easy to etch. However, in addition to being difficult to deposit by lower cost, lower temperature, more rapid "wet" technology such as electrodeposition, step coverage with Al is poor when the metallization features are scaled down to submicron size, resulting in decreased reliability of interconnections, high current densities at certain locations, and increased electromigration. In addition, low dielectric constant materials, e.g., polyamides, when employed as dielectric interlayers, create moisture/bias reliability problems when in contact with Al.

The use of via plugs filled with tungsten (W) may alleviate several problems associated with Al. However, most W-based processes are complex and expensive. In addition, the high resistivity of W may cause Joule heating which can undesirably enhance electromigration of Al in adjacent wiring. Moreover, W plugs are susceptible to void formation and high contact resistance at the interface with the Al wiring layer.

Copper (Cu) and Cu-based alloys are particularly attractive for use in large-scale integration (LSI), very large-scale integration (VLSI), and ultra large-scale integration (ULSI) devices requiring multilevel metallization systems for "back-end" processing of the semiconductor wafers on which the devices are based. Cu and Cu-based metallization systems have very low resistivities, i.e., significantly lower than that of W and even lower than those of previously preferred systems utilizing Al and its alloys, as well as significantly higher resistance to electromigration. Moreover, Cu and its alloys enjoy a considerable cost advantage over a number of the above-enumerated metals, notably silver and gold. Also, in contrast to Al and the refractory-type metals, Cu and its alloys can be readily deposited at low temperatures in good quality, bright layer form by well-known electroplating techniques, at deposition rates fully compatible with the requirements of device manufacturing throughput.

In addition to convenient, relatively low cost, low temperature, high throughput "wet" deposition by electroplating, Cu and its alloys are readily amenable to low cost, high throughput electroless deposition of high quality films for efficiently filling recesses such as vias, contact areas, and grooves and trenches forming interconnection routing. Such electroless plating generally involves the controlled autocatalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode from an external source (i.e., a power supply) for reducing copper ions in solution and depositing reduced metal atoms on the surface thereof. In either case, a nucleation/seed layer is required for catalysis and/or deposition on the types of substrates contemplated for use herein. Finally, while electroplating requires a continuous nucleation/seed layer, very thin and discontinuous islands of a catalytic metal may be employed with electroless plating.

As indicated above, a commonly employed method for forming "in-laid" metallization patterns such as are required for "back-end" metallization processing of semiconductor wafers employs "damascene" type technology. Generally, in such damascene technology, a recess (i.e., an opening) for forming, e.g., a via hole in an inter-layer dielectric for electrically connecting vertically separated metallization layers, is created in the inter-layer dielectric by conventional photolithographic and etching techniques, and filled with a metal plug, typically of W. Any excess conductive material (i.e., W) on the surface of the inter-layer dielectric is then removed by, e.g., CMP, wherein a moving pad is biased against the surface to be polished, with the interposition of a slurry containing abrasive particles (and other ingredients) therebetween.

A variant of the above-described technique, termed "dual damascene" processing, involves the formation of an opening comprising a lower contact or via hole section in communication with an upper groove or trench section, which opening is filled with a conductive material, typically a metal, to simultaneously form a conductive plug in electrical contact with a conductive line.

Referring now to FIG. 1, schematically shown therein in simplified cross-sectional view is a conventional damascene processing sequence employing relatively low cost, high manufacturing throughput electroplating and CMP techniques for forming recessed "back-end" metallization patterns (illustratively of Cu-based metallurgy but not limited thereto) in a semiconductor device formed in or on a semiconductor wafer substrate 1. In a first step, the desired arrangement of conductors is defined as a pattern of recesses 2 such as via holes, grooves, trenches, etc., formed (as by conventional photolithographic and etching techniques) in the surface 4 of a dielectric layer 3 (e.g., a silicon oxide and/or nitride or an organic polymeric material) deposited or otherwise formed over the semiconductor substrate 1. In a second step, a layer of Cu or Cu-based alloy 5 is deposited by conventional electroplating techniques to fill the recesses 2. In order to ensure complete filling of the recesses, the Cu-containing layer is deposited as a blanket (or "overburden") layer of excess thickness t so as to overfill the recesses 2 and cover the upper surface 4 of the dielectric layer 3. Next, the entire excess thickness t of the metal overburden layer 5 over the surface 4 of the dielectric layer 3 is removed by a CMP process utilizing an alumina-based slurry, leaving metal portions 5' in the recesses 2 with their exposed upper surfaces 6 substantially coplanar with the surface 4 of the dielectric layer 3.

The above-described conventional damascene process forms in-laid conductors 5' in the dielectric layer 3 while avoiding problems associated with other types of metallization patterning processing, e.g., blanket metal layer deposition, followed by photolithographic masking/etching and dielectric gap filling. In addition, such single or dual damascene-type processing can be performed with a variety of other types of substrates, e.g., printed circuit boards, with and/or without intervening dielectric layers, and with a plurality of metallization levels, i.e., five or more levels.

However, the use of electroplated metallization as described above has presented a number of problems, particularly, but not exclusively, with the use of Cu-based metallurgy. For example, although electroplating of Cu (a "wet" technique) has advantages over "dry" techniques (e.g., physical or chemical vapor deposition), such as rapid rates of deposition at low temperatures and good compatibility with "wet" CMP processing, it suffers from a drawback of ridge build-up over sharp corners of vias, grooves, and trenches. Thus, in conventional practices utilizing electrolytic deposition of Cu or Cu-based conductors, a rather thick blanket or overburden layer 5, typically about 0.5–1.5 µm thick, must be deposited over the recess-patterned surface to ensure complete filling (i.e., overfilling) of recesses 2 such as via holes, trenches, grooves, and other variously configured openings. Moreover, the resulting surface after overfilling may be highly non-planar, with the layer thicknesses thereof spanning the entire range of thicknesses given above.

Removal of such thick, non-planar blanket layers of Cu-based material in the subsequent CMP step for planarizing the interconnection metallization entails a number of disadvantages. For example, removal of the excess Cu-based material by CMP is slow and expensive. Specifically, typical Cu or Cu-based alloy removal rates by CMP employing a conventional alumina-based slurry are on the order of about 2,000–3,000 Å/min. Consequently, removal of 0.5–1.5 µm thick Cu-based layers can require long processing times extending up to about 5 minutes, considerably longer than that desired for good manufacturing throughput and reduced expense. In addition, removal of such thick as-deposited Cu or Cu-based blanket or overburden layers by CMP results in less uniform polished layers as are obtained when CMP is performed on thinner deposited layers. Such poor uniformity is generally accompanied by an increase in defects such as non-planarity ("dishing") and gouging ("erosion") between adjacent metallization lines.

A further drawback associated with Cu-based "back-end" metallization is the possibility of Cu diffusion into the underlying semiconductor, typically silicon, resulting in degradation of the semiconductive properties thereof, as well as poor adhesion of the deposited Cu or Cu-based alloy layer to various materials employed as dielectric interlayers, etc. As a consequence of these phenomena associated with copper-based metallurgy, it is generally necessary to provide an adhesion promoting and/or diffusion barrier layer intermediate the semiconductor substrate and the overlying copper-based metallization layer. Suitable materials for such adhesion/barrier layers include, e.g., titanium, tungsten, chromium, tantalum, and tantalum nitride.

Yet another drawback associated with the use of electroplated Cu or Cu-based damascene type metallization arises from incomplete filling of the recesses during the electroplating process, resulting in void and/or other defect formation causing a reduction in device quality. Referring now to FIGS. 2A–2B and 3A–3B, wherein like reference numerals are employed as previously to designate like features, illustrated therein are simplified schematic cross-sectional views showing sequential phases of the filling of a damascene type recess 2 formed in a dielectric layer 3 overlying a semiconductor wafer substrate 1, typically monocrystalline silicon, with an electroplated metal layer 5, e.g., of Cu or an alloy thereof. Referring more particularly to FIG. 2A, as illustrated therein, a thin adhesion/barrier layer 7 of titanium, tungsten, chromium, tantalum, or tantalum nitride and an overlying thin nucleation/seed layer 8 of refractory metal, Cu, or Cu-based alloy have been sequentially deposited in conventional thicknesses (by conventional techniques such as PVD, CVD, and PECVD) over the surfaces of the dielectric layer exposed within recess 2 and the non-recessed surface 4.

Referring now to FIG. 2B, shown therein is a typical "after-plating" view of recess 2, illustrating formation of an unfilled region 9 in the Cu or Cu-based alloy plug portion 5' of metallization layer 5, which unfilled region constitutes an undesirable void or defect resulting in lowered device quality and performance characteristics. While the exact mechanism of such occlusion or "pinching-off" of recess 2 at the upper, or mouth portion 2', thereof is not known with certainty, it is believed to result from increased rates of Cu electroplating at the corners of the nucleation/seed layer 8, e.g., at portions indicated by reference numeral 8A. It is further believed that such increased rates of deposition at corners 8A are related to the formation of higher electric fields at such corners during application of the electrical potentials necessary for effecting electroplating thereon.

The problem of recess occlusion or "pinching-off" during filling by Cu electroplating is further exacerbated, when, as is illustrated in FIGS. 3A–3B analogous to FIGS. 2A–2B, the corners of the nucleation/seed layer 8 include overhanging portions 8B which are frequently formed as a result of conventional processing techniques (PVD, CVD, etc.) for forming same. Such overhang formation further constricts the opening dimension of the recess 2 at the mouth portion 2' thereof and consequently increases the likelihood of "pinch-off" and concomitant void 9 formation.

As design rules for LSI, VLSI, and ULSI semiconductor devices extend further into the submicron range, such as 0.18 µm and below, e.g., about 0.15 µm and below, and the number of metallization levels increases, the reliability of the metallization/interconnect pattern becomes increasingly critical. Accordingly, the problem of "pinching-off" or occlusion of recess openings during metal (e.g., Cu or Cu-based alloy) filling thereof by electroplating requires resolution.

Thus there exists a need for metallization methodology enabling the formation of metal contact and interconnect members, particularly of Cu or Cu-based alloys, having high reliability, high yield, and high performance. In particular, there exists a need for eliminating the problem of void formation in metal recess-filling plugs which results when recesses are filled by conventional electroplating techniques.

The present invention addresses and solves the problems attendant upon conventional processes for manufacturing semiconductor devices utilizing electroplated Cu metallization, particularly in the formation of in-laid "back-end" contacts/metallization patterns by damascene techniques employing electroplating and CMP for obtaining good manufacturing throughput and product quality.

DISCLOSURE OF THE INVENTION

An advantage of the present invention is a method of manufacturing a device with a highly reliable metallization pattern at lower cost and with higher manufacturing throughput than obtainable with conventional process methodology.

Another advantage of the present invention is a method of manufacturing an integrated circuit device utilizing Cu-based "back-end" contacts and interconnections by a damascene process, with formation of highly reliable Cu or Cu-based alloy interconnect members having reduced incidence of defects such as voids therein.

Still another advantage of the present invention is a method for forming in-laid contacts and metallization patterns by electroplating and CMP techniques at an increased speed, lower cost, and with greater uniformity, planarity, and reliability than with conventional electroplating and CMP-based processes.

A further advantage of the present invention is an improved method for forming in-laid contacts and metallization patterns by a damascene-type electroplating and CMP-based process which is fully compatible with existing process methodology.

Additional advantages and other features of the present invention will be set forth in the description which follows and in part will become apparent to those having ordinary skill in the art upon examination of the following or may be learned from practice of the present invention. The advantages of the present invention may be realized and obtained as particularly pointed out in the appended claims.

According to one aspect of the present invention, the foregoing and other advantages are achieved in part by a method of forming a layer of an electrically conductive material filling at least one high aspect ratio recess formed in a surface of a workpiece, which method comprises the sequential steps of:

forming a dielectric layer on a surface of a substrate comprising the workpiece, the dielectric layer comprising a first, lower portion of a first dielectric material having a first thickness in contact with the substrate surface and a second, upper portion of a second dielectric material having a second thickness on the first, lower portion;

forming at least one high aspect ratio recess in the exposed surface of the dielectric layer by a two-stage etching process, the recess comprising:

(a) a mouth surface portion at the upper end thereof formed by a first etching process and comprising an opening having a width profile tapering from a first, wider width at the dielectric layer surface to a second, narrower width at a first depth below the dielectric layer surface substantially equal to the second thickness of the second, upper portion of the dielectric layer, the mouth surface portion bordering an adjacent, non-recessed substrate surface portion of the dielectric layer surface;

(b) an interior wall surface portion of the second, narrower width formed by the second etching process extending at a substantially constant width from the first depth to a second depth below the dielectric layer surface and terminating within the first, lower portion of the dielectric layer; and (c) a bottom surface portion at the second depth;

forming an electrically conductive nucleation/seed layer over recess surface portions (a), (b), and (c), wherein formation of overhanging portions of the nucleation/seed layer at the mouth surface portion (a) is substantially prevented due to the first, wider width of the recess and the inwardly tapered width profile thereof;

filling the recess with a layer of an electrically conductive material by electroplating the layer on the nucleation/seed layer over recess surface portions (a), (b), and (c);

whereby occlusion and/or pinching off of the recess mouth surface portion (a) during the electroplating due to formation thereon of overhanging portions of the conductive material layer on overhanging portions of the nucleation/seed layer is prevented.

In further embodiments according to the invention, the method comprises forming the electrically conductive nucleation/seed layer over the adjacent, non-recessed portion of the exposed surface of the dielectric layer; planarizing the recess-filled substrate surface by CMP; forming the first, lower portion of the dielectric layer from an inorganic-based dielectric material and the second, upper portion of the dielectric layer from an organic-based low dielectric constant material; forming the first width of the tapered width profile of the mouth surface profile (a) within the second, upper portion of the dielectric layer about 400–500 Å wider than the second width by a first etching process comprising isotropic wet chemical etching; forming the first depth at about 400–500 Å below the dielectric layer surface; forming the substantially constant width interior wall surface portion within the first, lower portion of the dielectric layer by a second etching process comprising anisotropic dry etching process selected from sputter and plasma etching; providing a substrate comprising a semiconductor wafer having a surface and forming the dielectric layer on the wafer surface; and wherein the at least one recess formed therein comprises a plurality of recesses of different widths and/or depths for providing electrical contact areas, vias, interlevel metallization and/or interconnection routing of at least one active device region or component of the semiconductor wafer.

In other embodiments according to the present invention, the semiconductor wafer comprises monocrystalline silicon or gallium arsenide having integrated circuitry formed therein or thereon; the first, lower portion of the dielectric layer comprises an inorganic-based dielectric material selected from an oxide, nitride, and an oxynitride of silicon; the second, upper portion of the dielectric layer comprises an organic-based or derived low dielectric constant material selected from hydrogen silsesquioxane (HSQ), tetraethyl orthosilicate (TEOS), benzocyclobutene (BCB), parylene, and polyimide; the layer of electroplated electrically conductive material comprises a metal selected from the group consisting of copper, chromium, nickel, cobalt, gold, silver, aluminum, tungsten, titanium, tantalum, and alloys thereof, preferably copper or an alloy thereof, the nucleation/seed layer comprises a refractory metal, copper, or an alloy thereof, at least recess surface portions (a), (b), and (c) are provided with an adhesion promoting and/or diffusion barrier layer comprising chromium, tantalum, or tantalum nitride prior to providing the nucleation/seed layer thereon, and the copper or copper alloy recess-filled, metallized surface is planarized by CMP utilizing an alumina-based slurry.

Another aspect of the present invention is a method of manufacturing a semiconductor device, which method comprises the sequential steps of:

forming a dielectric layer on a surface of a semiconductor wafer substrate, the dielectric layer comprising a first, lower portion of a first dielectric material having a first thickness in contact with the wafer surface and a second, upper portion of a second dielectric material having a second thickness on the first, lower portion;

forming a plurality of spaced-apart, high aspect ratio recesses in the surface of the dielectric layer by a two-stage etching process, with non-recessed surface areas of the dielectric layer therebetween, wherein each recess comprises:

(a) a mouth surface portion at the upper end thereof formed by a first, isotropic etching process and bordering the adjacent, non-recessed dielectric layer surface area, the mouth surface portion comprising an opening having a width profile tapering from a first, wider width at the dielectric layer surface to a second, narrower width at a first depth below the dielectric layer surface substantially equal to the second thickness of the second, upper portion of the dielectric layer;

(b) an interior wall surface portion of the second, narrower width formed by an anisotropic etching process extending at a substantially constant width from the first depth to a second depth below the dielectric layer surface and terminating within the first, lower portion of the dielectric layer; and (c) a bottom surface portion at the second depth;

forming an electrically conductive nucleation/seed layer over each of the recess surface portions (a), (b), and (c) and extending over the respective adjacent, non-recessed dielectric layer surface area, formation of overhanging portions of the nucleation layer at the mouth surface portions (a) being substantially prevented due to the first, wider width of the recesses at the dielectric layer surface and the inwardly tapered width profile thereof; and filling the recesses with a layer of electrically conductive material by electroplating the layer on the nucleation/seed layer over respective recess surface portions (a), (b), and (c), with electroplating also occurring on the surfaces of the nucleation/seed layer over the respective adjacent, non-recessed dielectric layer surface areas:

whereby occlusion and/or pinching off of the recess mouth portions (a) during electroplating due to formation thereon of overhanging portions of the conductive material layer on overhanging portions of the nucleation/seed layer is prevented.

According to yet another aspect according to the present invention, integrated circuit semiconductor devices comprising in-laid, "back-end" metallization patterns including completely filled recesses formed according to the inventive method, are provided.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, in which like reference numerals are employed throughout to designate similar features, wherein.

DESCRIPTION OF THE INVENTION

Figure 1:
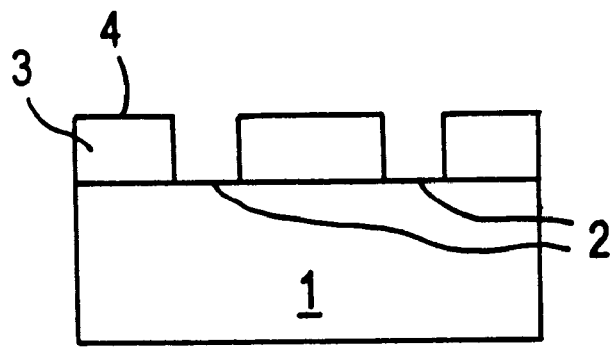
FIG. 1 illustrates, in simplified, cross-sectional schematic form, a sequence of steps for performing a damascene type Cu electroplating and CMP process according to conventional practices.
Figure 1:
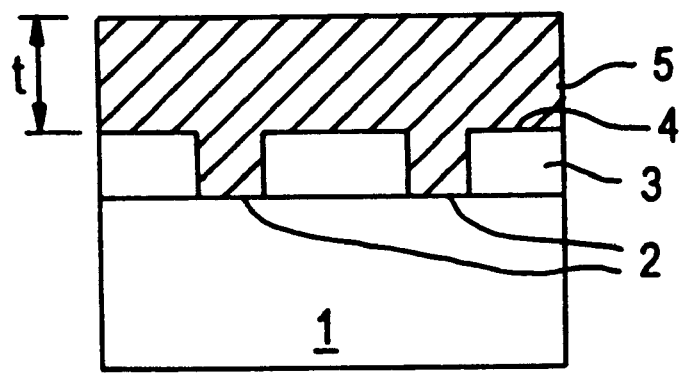
Figure 1:
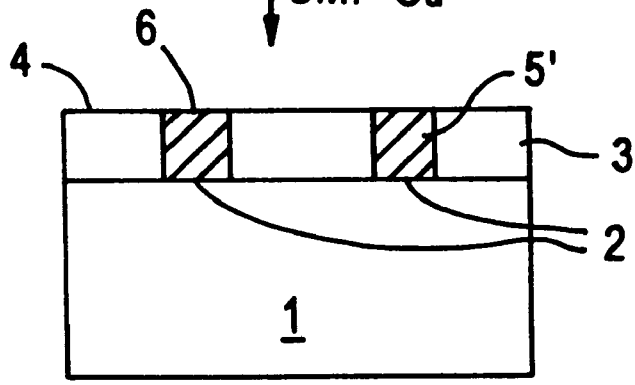

The present invention addresses and solves problems arising from manufacturing semiconductor devices comprising in-laid, "back-end" metallization patterns, wherein, as part of the fabrication methodology, a plurality of recesses formed in the surface of a dielectric layer overlying a semiconductor substrate are filled with a metal, e.g., copper or copper alloy, by an electroplating process. More specifically, the present invention advantageously enables the complete (i.e., voidless) filling of openings in a dielectric layer, such as damascene openings in a silicon oxide layer, while preventing occlusion and/or "pinching-off" of the openings while the openings are filled during an electroplating process.

The present invention enables the formation of a metal, e.g., Cu or Cu-based alloy, contact and interconnect pattern with completely and uniformly filled openings, thereby enhancing product reliability and performance. Briefly stated, according to the present invention, the mouth surface portions of recesses formed in a dielectric layer overlying a semiconductor substrate having active device regions formed therein or thereon are selectively widened, relative to the interior wall surface portions of the recesses. As a consequence, overhanging portions of a nucleation/seed layer (or composite barrier layer/nucleation seed layer) deposited on the recessed areas and the adjacent nonrecessed areas prior to electroplating thereon do not form at the recess mouth surface portions, thereby effectively preventing formation of overhanging portions of the electroplated recess-filling material (e.g., copper) which eventually coalesce and cause occlusion or "pinching-off" of the openings at the mouths of the recesses.

Cu and/or Cu-based alloy interconnect members formed in accordance with embodiments of the present invention can be, but are not limited to, interconnects formed by damascene technology. Thus, embodiments of the present invention include providing a substrate (e.g., a semiconductor wafer) having a dielectric layer thereon with a plurality of high aspect ratio recesses (i.e., damascene openings) formed in its exposed, upper surface, the mouth surface portions of the recesses being wider than the interior wall surface portions thereof; successively depositing a thin, electrically conductive adhesion promoting/diffusion barrier layer (e.g., TaN) and a thin, electrically conductive nucleation/seed layer (e.g., Cu or Cu alloy) lining the interior wall and mouth surfaces of the recesses and atop the non-recessed surfaces intermediate the recesses; filling the recesses with metal (e.g., Cu or Cu-based alloy) by electroplating; and planarizing the resultant upper surface by CMP.

Given the present disclosure and the objectives of the invention, the electroplating parameters can be optimized for use in particular situations. For example, it was found suitable to employ a conventional $CuSO_4$-based bright copper plating bath (e.g., such as Enthone "M", available from Enthone OMI, New Haven, CT) at current densities of about 10 to about 30 $mA/cm^2$ and bath temperatures of about 15 to about 30° C. The substrate can be doped monocrystalline silicon or gallium arsenide. The dielectric layer(s) can comprise any of those conventionally employed in the manufacture of integrated circuit semiconductor devices, e.g., inorganic-based dielectric materials such as silicon oxides, silicon nitrides, and silicon oxynitrides, and low dielectric constant organic-based or derived materials such as hydrogen silsesquioxane (HSQ), benzocyclobutene (BCB), tetraethyl orthosilicate (TEOS), parylene, and polyimide.

Figure 4:
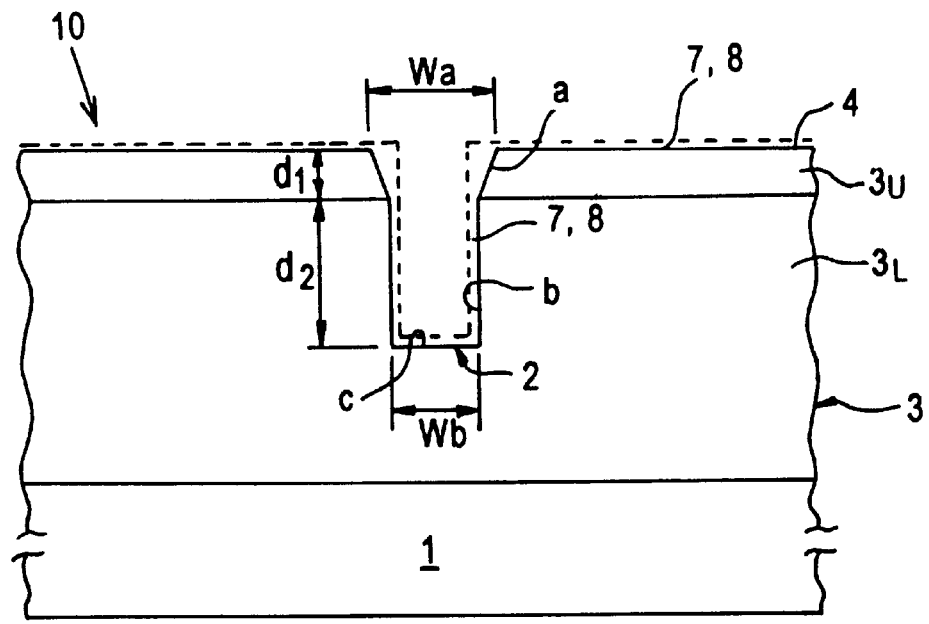
FIG. 4 illustrates, in simplified, cross-sectional form, a high aspect ratio groove or recess formed in the surface of a workpiece according to the method of the present invention and comprising a mouth surface portion (a) comprising an opening adjacent non-recessed surface area portions, the opening having a width profile tapering from a first, wider width at the workpiece surface to a second, narrower width at a first depth below the workpiece surface.

An embodiment of the present invention will now be described with reference to FIGS. 4–5. Referring initially to FIG. 4, schematically shown therein is a cross-sectional view of an illustrative, but not limitative, high-aspect ratio recess or opening 2 formed in a surface of a workpiece 10 comprising substrate 1 according to the inventive methodology. As employed herein, the term "high aspect ratio" recess refers to an opening having a depth-to-width ratio of at least 2:1, and up to and including a ratio of about 5:1. For sub-micron dimensioned, high-density integration semiconductor devices employing multiple levels of metallization, e.g., up to 5 levels, such high aspect ratio openings may have a width of from about 1,500 to about 5,000 Å, e.g., about 3,000 Å, with a corresponding depth of from about 3,000 Å to about 1.75 $\mu$m.

According to the inventive methodology, a dielectric layer 3 is formed in contact with the upper surface of substrate 1, typically a monocrystalline semiconductor wafer, e.g., of silicon or gallium arsenide, and comprising at least one active device or region formed therein or thereon, which dielectric layer 3 comprises a first, lower portion $3_L$ comprising a layer of a first dielectric material of a first thickness in contact with the substrate surface and a second, upper portion $3_U$ comprising a layer of a second dielectric material of second thickness atop the first, lower portion. By way of illustration, but not limitation, for high-aspect ratio recesses of the type contemplated herein for use in fabricating high-density integration semiconductor devices, the first thickness of the first, lower portion $3_L$ is selected to exceed the depth of recess 2 and thus can exceed about 2 $\mu$m for 5:1 aspect ratio openings as described above. The second thickness of the second, upper portion $3_U$ is substantially less than the first thickness, and typically is about 400–500 Å.

According to another aspect of the inventive methodology, the dielectric materials of the first, lower portion $3_L$ and second, upper portion $3_U$ of dielectric layer 3 are selected such that second, upper portion $3_U$ is readily isotropically etched by a first etching process to form the inwardly tapered width profile mouth surface portion (a), whereas the first, lower portion $3_L$ is readily anisotropically etched by a second etching process to form the substantially constant width interior wall surface portion (b). In an embodiment according to the present invention, differently constituted dielectric materials having different etch chemistries are utilized for the first and second portions, e.g., an inorganic-based dielectric material such as, for example, an oxide, nitride, or oxynitride of silicon as the first, lower portion $3_L$, and an organic-based or derived low dielectric constant ("low k") dielectric material such as, for example, hydrogen silsesquioxane (HSQ), tetraethyl orthosilicate (TEOS), benzocyclobutene (BCB), parylene, or polyimide as the second, upper portion $3_U$. By way of illustration, but not limitation, in an exemplary embodiment according to the invention, the second, upper portion $3_U$ is initially subjected to a first etching process comprising isotropic etching with aqueous HF under conditions and for an interval sufficient for forming the inwardly tapered mouth surface portion (a) extending into the dielectric layer 3 for a depth substantially equal to the thickness $d_1$ of the second, upper portion $3_U$, at which time the liquid isotropic etchant is removed and the first, lower portion $3_L$ subjected to a second etching process comprising anisotropic dry etching, as by sputter or plasma etching, in conventional manner, for an interval sufficient to provide a desired depth $d_2$ of wall surface portion (b) within the first, lower portion $3_L$ of dielectric layer 3.

In a variant of the above-described exemplary embodiment, anisotropic dry etching of both the upper and lower portions $3_U$ and $3_L$ is first performed, as by sputter or plasma etching, to form a substantially constant width recess extending through upper portion $3_U$ and into lower portion $3_L$ for the desired depth $d_2$, followed by selective isotropic etching of the upper portion $3_U$ for forming the inwardly tapered width recess mouth surface portion. In other instances, different wet chemical or dry etching processes are employed for each of the isotropic and anisotropic etching steps. However, it should be recognized that, given the present disclosure and objectives of the invention, specific etching conditions can be readily selected and/or optimized by the routineer for use in a particular situation.

Referring still to FIG. 4, according to the present invention, recess or opening 2 formed in dielectric layer 3 atop substrate 1 of semiconductor wafer workpiece 10 by a two-stage etching process, e.g., as described supra, for purposes of the following discussion, a mouth surface portion a at the upper end thereof, an interior wall surface portion b, and a bottom surface portion c at the lower end thereof. As illustrated, the width of mouth surface portion a tapers inwardly from a first, wider width $w_a$ at the non-recessed substrate surface 4 to a second, narrower width $w_b$ at a first depth $d_1$ below surface 4 (substantially corresponding to the second thickness of the second, upper portion $3_U$ of the dielectric layer 3), whereas the width of interior wall surface portion b remains substantially constant for depth $d_2$ extending into the first, lower portion $3_L$ of dielectric layer 3 to bottom surface portion c, such that the total depth $d_t = d_1 + d_2$. By way of illustration but not limitation, for a typical recess or opening such as a via hole or groove for interconnection routing in high-density semiconductor devices such as are contemplated herein, the width $W_a$ at the upper end of mouth surface portion a is about 300–600 Å greater than that of the interior wall surface portion $w_b$ (i.e., $w_a = w_b + 300-600$ Å) and the first depth $d_1$ (corresponding to the thickness of the second, upper portion $3_U$ of the dielectric layer 3) is about 400–500 Å below substrate surface 4.

Figure 3A:
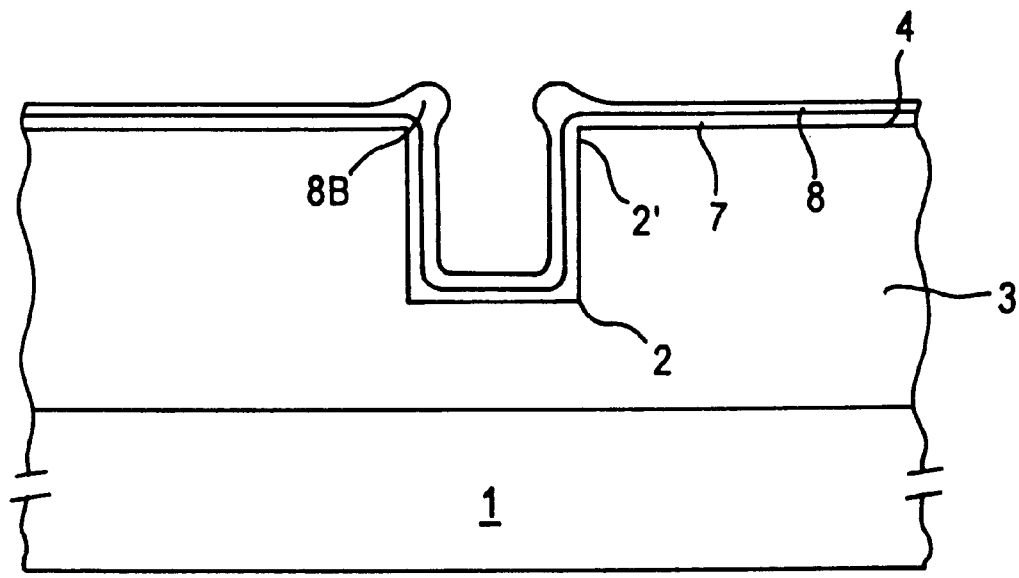
Figure 3B:
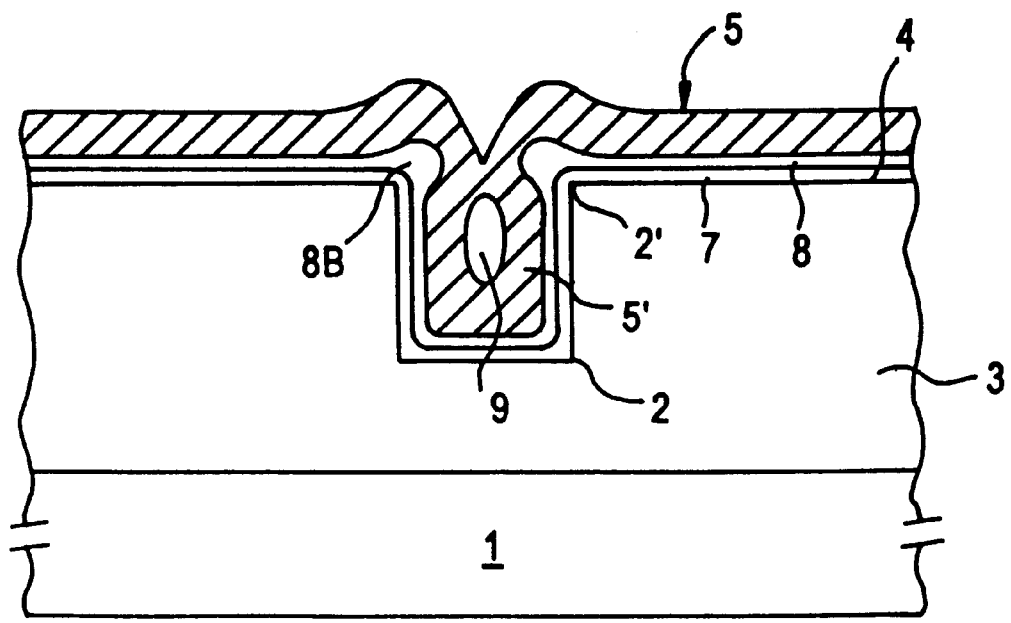

The structure shown in FIG. 4 including mouth surface portion a having a tapered width decreasing in size with depth below substrate surface 4 advantageously exhibits a substantially reduced tendency for overhang formation by the nucleation seed layer 8, relative to that illustrated in FIG. 3A. As previously indicated, in Cu-based metallization processing by electroplating, adhesion/barrier and nucleation/seed layers 7, 8, respectively, are required to be preliminarily deposited over recessed as well as non-recessed surface areas to receive plating thereon. However, overhanging portions 8A of the nucleation/seed layer 8 are frequently formed at sharp corners such as are present at the mouth surface portions a of recesses or openings, as a result of conventional processing techniques (e.g., PVD, CVD, etc.) for forming same. Such overhang formation further constricts the opening dimension of the recess at the mouth portion thereof and consequently increases the likelihood of "pinch-off" and attendant void 9 formation, as shown in FIG. 3B. In this regard, the dashed line shown in FIG. 4 indicates the combined thickness profile of conventional adhesion/barrier and nucleation/seed layers 7, 8, respectively, formed to conventional thicknesses (e.g., about 100–400 Å for the adhesion/barrier layer 7 and about 1000–2000 Å for the nucleation/seed layer 8, for a total thickness of about 1100–2400 Å), wherein it is evident that overhanging portions such as those indicated at 8B in FIGS. 3A–3B, do not occur according to the present invention. The increased thickness of the combined adhesion/barrier+nucleation/seed layer over the tapered width mouth surface portion a of the recess suggests that the deposition rates of layers 7, 8 thereat are not significantly reduced vis-à-vis the deposition rates at the corners of conventional, non-tapered mouth surface portion recesses. Rather, it appears that the tapered mouth surface portion a according to the invention which provides a continuously increasing width at the upper portion of the recess is able to accommodate the additional plating thickness due to increased deposition rates thereat, thereby resulting in a substantially continuously vertically oriented sidewall with a relatively sharp transition into a horizontally oriented substrate surface.

Figure 2A:
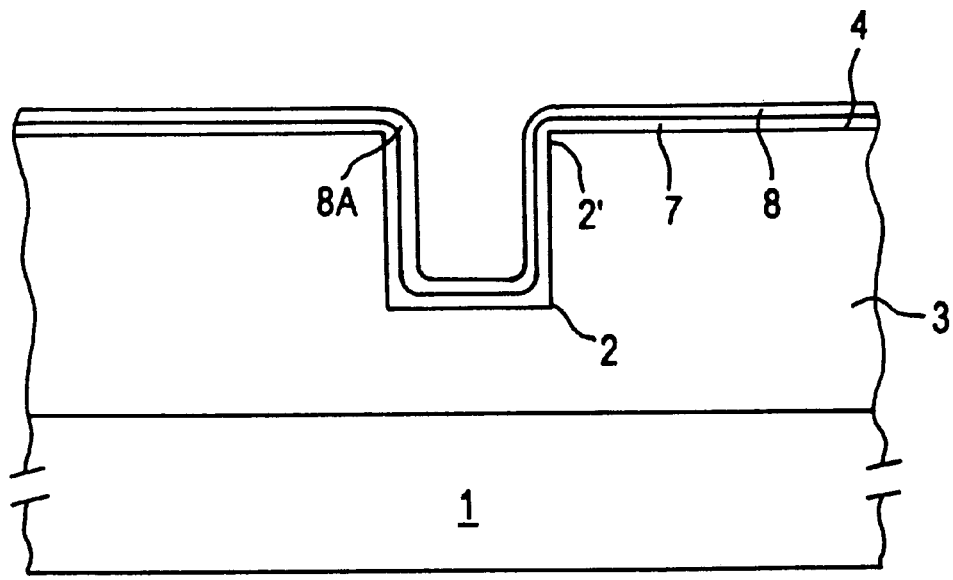
FIGS. 2A–2B and 3A–3B each illustrate in simplified, cross-sectional schematic form, sequential phases of an electroplating step comprising part of a damascene type metallization process.
Figure 2B:
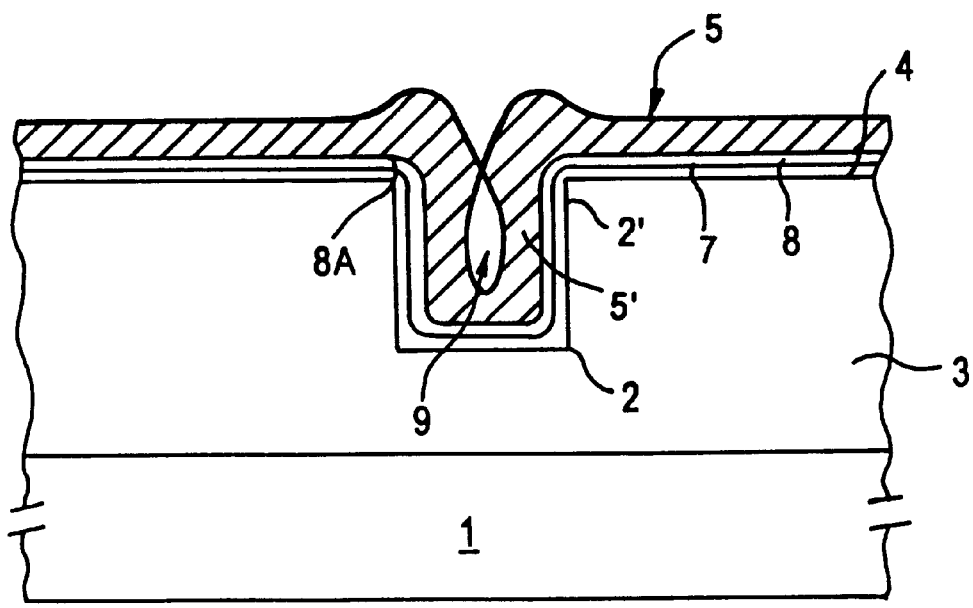
Figure 5:
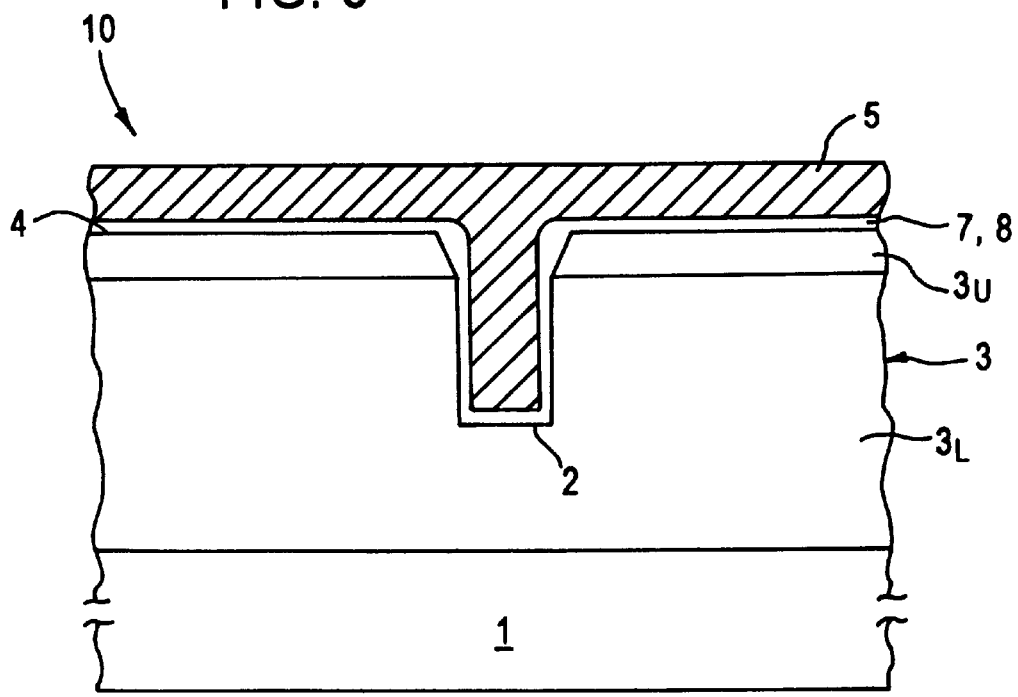
FIG. 5 illustrates, in simplified, cross-sectional form, the portion of the workpiece of FIG. 4 after electroplating thereon for filling the recess with metal.

Referring now to FIG. 5, shown therein is a schematic, partial cross-sectional view illustrating a metal (e.g., Cu) electroplated workpiece wafer 10 of FIG. 4, wherein, in contrast with conventional electroplating of high aspect ratio recessed areas shown in FIGS. 2B and 3B, enhanced deposition at the recess mouth surface portion a resulting in premature "pinching-off" of the recess with attendant void 9 formation is substantially prevented by the presence of a tapered opening contour thereat, resulting in a substantially voidless metal plug 5 substantially completely filling recess 2 and extending over surface 4 of dielectric layer 3 formed on the wafer surface.

In a subsequent step, not illustrated, the thus-electroplated wafer is subjected to a process for planarizing the plated surface, as by CMP utilizing an alumina-based slurry, similarly to the last step illustrated in FIG. 1.

The present invention enables the formation of extremely reliable interconnect members and patterns, e.g., of Cu or Cu-based alloy, by providing a method for voidless filling of high aspect ratio recesses. The inventive process thereby effects a substantial reduction in time and cost of "back-end" damascene-type processing for forming in-laid metallization patterns. In addition, the inventive method is equally applicable for use in dual-damascene type processing.

The present invention is applicable to the formation of various types of in-laid metallization patterns, illustratively, but not limited to, Cu and/or Cu-based alloys. The present invention is particularly applicable to the manufacture of semiconductor devices having sub-micron dimensioned metallization features and high aspect ratio openings. The invention is also particularly well suited to the manufacture of circuit boards and other types of electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of forming a layer of an electrically conductive material filling at least one high aspect ratio recess formed in a surface of a workpiece, which method comprises the sequential steps of:

forming a dielectric layer on a surface of a substrate comprising said workpiece, said dielectric layer comprising a first, lower portion of a first dielectric material having a first thickness in contact with said substrate surface and a second, upper portion of a second dielectric material having a second thickness on said first, lower portion;

forming at least one high aspect ratio recess in the exposed surface of said dielectric layer by a two-stage etching process, said recess comprising:

(a) a mouth surface portion at the upper end thereof formed by a first etching process and comprising an opening having a width profile tapering from a first, wider width at said dielectric layer surface to a second, narrower width at a first depth below said dielectric layer surface substantially equal to said second thickness of said second, upper portion of said dielectric layer, said mouth surface portion bordering an adjacent, non-recessed portion of said dielectric layer surface;

(b) an interior wall surface portion of said second, narrower width formed by a second etching process extending at a substantially constant width from said first depth to a second depth below said dielectric layer surface and terminating within said first, lower portion of said dielectric layer; and (c) a bottom surface portion at said second depth;

forming an electrically conductive nucleation/seed layer over recess surface portions (a), (b), and (c), wherein formation of overhanging portions of said nucleation/seed layer at said mouth surface portion (a) is substantially prevented due to the first, wider width of said recess at the dielectric layer surface and the inwardly tapered width profile thereof;

filling said recess with a layer of an electrically conductive material by electroplating said layer on the nucleation/seed layer over recess surface portions (a), (b), and (c);

whereby occlusion and/or pinching off of the recess mouth surface portion (a) during said electroplating due to formation thereon of overhanging portions of said conductive material layer on overhanging portions of said nucleation/seed layer is prevented.

2. The method as in claim 1, further comprising forming said electrically conductive nucleation/seed layer over the adjacent, non-recessed portion of said dielectric layer surface, and electroplating said layer of electrically conductive material thereon.

3. The method as in claim 2, further comprising planarizing the recess-filled surface of said substrate by chemical-mechanical polishing (CMP).

4. The method as in claim 1, wherein said first etching process comprises performing isotropic etching of said second, upper portion of second dielectric material and said second etching process comprises anisotropic etching of said first, lower portion of first dielectric material.

5. The method as in claim 4, comprising performing wet chemical etching of said second, upper portion of second dielectric material followed by performing dry plasma or sputter etching of said first, lower portion of first dielectric material.

6. The method as in claim 5, comprising forming said first width about 300–600 Å wider than said second width and said first depth is about 400–500 Å below said dielectric layer surface.

7. The method as in claim 5, wherein said substrate comprises a semiconductor wafer of monocrystalline silicon or gallium arsenide having a surface, comprising forming said dielectric layer on said wafer surface, and said at least one recess formed therein comprises a plurality of recesses of different widths and/or depths for providing vias, interlevel metallization, and/or interconnection routing of at least one active device region or component of said semiconductor wafer.

8. The method as in claim 7, comprising forming said dielectric layer from a first, lower portion comprising an inorganic-based dielectric material selected from an oxide, nitride, and oxynitride of silicon, and from a second, upper portion comprising an organic-based or derived low dielectric constant material selected from hydrogen silsesquioxane (HSQ), tetraethyl orthosilicate (TEOS), benzocyclobutene (BCB), parylene, and polyimide.

9. The method as in claim 7, comprising electroplating a layer of an electrically conductive material comprising a metal selected from the group consisting of copper, chromium, nickel, cobalt, gold, silver, aluminum, tungsten, titanium, tantalum, and alloys thereof.

10. The method as in claim 9, comprising electroplating a layer of copper or a copperbased alloy.

11. The method as in claim 10, further comprising providing at least said recess surface portions (a), (b), and (c) with an adhesion promoting and/or diffusion barrier layer prior to providing said nucleation/seed layer thereon.

12. The method as in claim 11, comprising providing said adhesion/barrier layer as a material selected from titanium, tungsten, chromium, tantalum, and tantalum nitride.

13. The method as in claim 11, comprising providing said nucleation/seed layer as a material selected from refractory metals, copper, and copper-based alloys by a physical or chemical vapor deposition process.

14. A method of manufacturing a semiconductor device, which method comprises the sequential steps of:

forming a dielectric layer on a surface of a semiconductor wafer substrate, said dielectric layer comprising a first, lower portion of a first dielectric material having a first thickness in contact with said wafer surface and a second, upper portion of a second dielectric material having a second thickness on said first, lower portion;

forming a plurality of spaced-apart, high aspect ratio recesses in the surface of said dielectric layer by a two-stage etching process, with non-recessed surface areas of said dielectric layer therebetween, wherein each said recess comprises:

(a) a mouth surface portion at the upper end thereof formed by a first, isotropic etching process and bordering the adjacent, non-recessed dielectric layer surface area, said mouth surface portion comprising an opening having a width profile tapering from a first, wider width at said dielectric layer surface to a second, narrower width at a first depth below said dielectric layer surface substantially equal to said second thickness of said second, upper portion of said dielectric layer;

(b) an interior wall surface portion of said second, narrower width formed by an anisotropic etching process extending at a substantially constant width from said first depth to a second depth below said dielectric layer surface and terminating within said first, lower portion of said dielectric layer; and (c) a bottom surface portion at said second depth;

forming an electrically conductive nucleation/seed layer over each of said recess surface portions (a), (b), (c) and extending over the respective adjacent, non-recessed dielectric layer surface area, formation of overhanging portions of said nucleation/seed layer at said mouth surface portions (a) being substantially prevented due to the first, wider width of said recesses at the dielectric layer surface and the inwardly tapered width profile thereof; and filling said recesses with a layer of electrically conductive material by electroplating said layer on the nucleation/ seed layer over respective recess surface portions (a), (b), and (c), with said electroplating also occurring on the surfaces of said nucleation/seed layer over the respective adjacent, non-recessed dielectric layer surface areas;

whereby occlusion and/or pinching-off of the recess mouth portions (a) during said electroplating due to formation thereon of overhanging portions of said conductive material layer on overhanging portions of said nucleation/seed layer is prevented.

15. The method as in claim 14, comprising providing a wafer of monocrystalline silicon or gallium arsenide having integrated circuitry formed therein or thereon; said first, lower portion of said dielectric layer comprises an inorganic-based dielectric material selected from an oxide, nitride, and oxynitride of silicon; said second, upper portion of said dielectric layer comprises an organic-based or derived low dielectric constant material selected from hydrogen silsesquioxane (HSQ), tetraethyl orthosilicate (TEOS), benzocyclobutene (BCB), parylene, and polyimide; and said plurality of recesses formed therein are of different widths and/or depths for providing vias, interlevel metallization, and/or interconnection routing of said integrated circuitry; said nucleation/seed layer comprises a refractory metal, copper, or a copper-based alloy; and said layer of electrically conductive material comprises copper or a copper-based alloy.

16. The method as in claim 15, comprising performing said first, isotropic etching process by wet chemical etching of said second, upper portion of second dielectric material followed by performing anisotropic dry plasma or sputter etching of said first, lower portion of first dielectric material.

17. The method as in claim 15, further comprising planarizing the copper or copper-based alloy-filled recesses by chemical chemical-mechanical polishing utilizing an alumina-based slurry.

18. The method as in claim 17, comprising providing at least said recess surface portions (a), (b), and (c) with an adhesion promoting and/or diffusion barrier layer selected from titanium, tungsten, chromium, tantalum, and tantalum nitride prior to providing said nucleation/seed layer thereon.

* * * * *